(12) United States Patent
Shimada et al.

(10) Patent No.: US 7,683,597 B2
(45) Date of Patent: Mar. 23, 2010

(54) PWM SIGNAL GENERATING CIRCUIT AND POWER SUPPLY APPARATUS COMPRISING SUCH PWM SIGNAL GENERATING CIRCUIT

(75) Inventors: Takae Shimada, Hitachi (JP);
Fumikazu Takahashi, Hitachi (JP);
Hiroyuki Shoji, Hitachi (JP); Yoshihide Takahashi, Odawara (JP); Wataru Mochizuki, Ninomiya (JP)

(73) Assignee: Hitachi Computer Peripherals Co., Ltd., Kanagawa (JP)

( * ) Notice: Subject to any disclaimer, the term of this patent is extended or adjusted under 35 U.S.C. 154(b) by 165 days.

(21) Appl. No.: 11/865,743

(22) Filed: Oct. 2, 2007

(65) Prior Publication Data
US 2008/0079407 A1    Apr. 3, 2008

(30) Foreign Application Priority Data
Oct. 2, 2006  (JP) .............................. 2006-270795

(51) Int. Cl.
*G05F 1/00*    (2006.01)
*H03K 3/017*   (2006.01)

(52) U.S. Cl. ........................................ 323/283; 327/175
(58) Field of Classification Search ................. 323/283; 327/175, 172
See application file for complete search history.

(56) References Cited

U.S. PATENT DOCUMENTS 6,658,583 B1 * 12/2003 Kudo et al. ................. 713/500

7,508,899 B2 * 3/2009 Kris .......................... 375/376

FOREIGN PATENT DOCUMENTS

| JP | 08-300723 | 11/1996 |
|---|---|---|
| JP | 10-094261 | 4/1998 |
| JP | 2001-016081 | 1/2001 |
| JP | 2001-169541 | 6/2001 |
| JP | 2004-032732 | 1/2004 |
| JP | 2005-354854 | 12/2005 |

* cited by examiner

*Primary Examiner*—Shawn Riley
(74) *Attorney, Agent, or Firm*—Antonelli, Terry, Stout & Kraus, LLP.

(57) ABSTRACT

To provide a power supply apparatus having high control resolution of an output power. A PWM signal generating circuit includes: a non-inverting element 31, and an inverting element 32; and further includes a counter 11 for performing count operation in response to rising of a clock signal, a counter 12 for performing count operation in response to falling of the clock signal, comparison circuits 21, 22, and a multiplexer 20. These circuit elements are controlled by PWM control means 10. As another circuit element, the PWM signal generating circuit includes a logical sum element 33. The PWM signal generating circuit serves to arbitrarily change both period and logic "H" time of a PWM signal to be outputted at a time interval which is one half of the clock period. Thus, there is provided a power supply apparatus in which resolution of a PWM signal has been improved within a broad duty range, and fine control of an output power has been performed within a broad output power range.

21 Claims, 8 Drawing Sheets

FIG. 5

| PERIOD OF PWM SIGNAL [CLOCK PERIOD] | LOGIC "H" TIME OF PWM SIGNAL [CLOCK PERIOD] | LOGIC "L" TIME OF PWM SIGNAL [CLOCK PERIOD] | DUTY OF PWM SIGNAL [%] | DUTY CHANGE QUANTITY OF PWM SIGNAL [%] |
|---|---|---|---|---|
| 100.0 | 50.0 | 50.0 | 50.00 | – |
| 99.5 | 50.0 | 49.5 | 50.25 | 0.25 |
| 100.0 | 50.5 | 49.5 | 50.50 | 0.25 |
| 99.5 | 50.5 | 49.0 | 50.75 | 0.25 |
| 100.0 | 51.0 | 49.0 | 51.00 | 0.25 |
| 99.5 | 51.0 | 48.5 | 51.26 | 0.26 |
| 100.0 | 51.5 | 48.5 | 51.50 | 0.24 |
| 99.5 | 51.5 | 48.0 | 51.76 | 0.26 |
| 100.0 | 52.0 | 48.0 | 52.00 | 0.24 |
| 99.5 | 52.0 | 47.5 | 52.26 | 0.26 |
| 100.0 | 52.5 | 47.5 | 52.50 | 0.24 |
| 99.5 | 52.5 | 47.0 | 52.76 | 0.26 |
| 100.0 | 53.0 | 47.0 | 53.00 | 0.24 |
| 200.0 | 100.0 | 100.0 | 50.00 | – |
| 199.5 | 100.0 | 99.5 | 50.13 | 0.13 |
| 200.0 | 100.5 | 99.5 | 50.25 | 0.12 |
| 199.5 | 100.5 | 99.0 | 50.38 | 0.13 |
| 200.0 | 101.0 | 99.0 | 50.50 | 0.12 |
| 199.5 | 101.0 | 98.5 | 50.63 | 0.13 |
| 200.0 | 101.5 | 98.5 | 50.75 | 0.12 |
| 199.5 | 101.5 | 98.0 | 50.88 | 0.13 |
| 200.0 | 102.0 | 98.0 | 51.00 | 0.12 |
| 199.5 | 102.0 | 97.5 | 51.13 | 0.13 |
| 200.0 | 102.5 | 97.5 | 51.25 | 0.12 |
| 199.5 | 102.5 | 97.0 | 51.38 | 0.13 |
| 200.0 | 103.0 | 97.0 | 51.50 | 0.12 |
| 199.5 | 103.0 | 96.5 | 51.63 | 0.13 |
| 200.0 | 103.5 | 96.5 | 51.75 | 0.12 |
| 199.5 | 103.5 | 96.0 | 51.88 | 0.13 |
| 200.0 | 104.0 | 96.0 | 52.00 | 0.12 |
| 199.5 | 104.0 | 95.5 | 52.13 | 0.13 |
| 200.0 | 104.5 | 95.5 | 52.25 | 0.12 |
| 199.5 | 104.5 | 95.0 | 52.38 | 0.13 |
| 200.0 | 105.0 | 95.0 | 52.50 | 0.12 |
| 199.5 | 105.0 | 94.5 | 52.63 | 0.13 |
| 200.0 | 105.5 | 94.5 | 52.75 | 0.12 |
| 199.5 | 105.5 | 94.0 | 52.88 | 0.13 |
| 200.0 | 106.0 | 94.0 | 53.00 | 0.12 |

FIG. 6

| PERIOD OF PWM SIGNAL [CLOCK PERIOD] | LOGIC "H" TIME OF PWM SIGNAL [CLOCK PERIOD] | LOGIC "L" TIME OF PWM SIGNAL [CLOCK PERIOD] | DUTY OF PWM SIGNAL [%] | DUTY CHANGE QUANTITY OF PWM SIGNAL [%] |
|---|---|---|---|---|
| 100.0 | 50.0 | 50.0 | 50.00 | – |
| 100.0 | 51.0 | 49.0 | 51.00 | 1.00 |
| 100.0 | 52.0 | 48.0 | 52.00 | 1.00 |
| 100.0 | 53.0 | 47.0 | 53.00 | 1.00 |
| 200.0 | 100.0 | 100.0 | 50.00 | – |
| 200.0 | 101.0 | 99.0 | 50.50 | 0.50 |
| 200.0 | 102.0 | 98.0 | 51.00 | 0.50 |
| 200.0 | 103.0 | 97.0 | 51.50 | 0.50 |
| 200.0 | 104.0 | 96.0 | 52.00 | 0.50 |
| 200.0 | 105.0 | 95.0 | 52.50 | 0.50 |
| 200.0 | 106.0 | 94.0 | 53.00 | 0.50 |

FIG. 7

| PERIOD OF PWM SIGNAL [CLOCK PERIOD] | LOGIC "H" TIME OF PWM SIGNAL [CLOCK PERIOD] | LOGIC "L" TIME OF PWM SIGNAL [CLOCK PERIOD] | DUTY OF PWM SIGNAL [%] | DUTY CHANGE QUANTITY OF PWM SIGNAL [%] |
|---|---|---|---|---|
| 100.0 | 10.0 | 90.0 | 10.00 | – |
| 99.5 | 10.0 | 89.5 | 10.05 | 0.05 |
| 99.0 | 10.0 | 89.0 | 10.10 | 0.05 |
| 98.5 | 10.0 | 88.5 | 10.15 | 0.05 |
| 98.0 | 10.0 | 88.0 | 10.20 | 0.05 |
| 97.5 | 10.0 | 87.5 | 10.26 | 0.05 |
| 97.0 | 10.0 | 87.0 | 10.31 | 0.05 |
| 96.5 | 10.0 | 86.5 | 10.36 | 0.05 |
| 96.0 | 10.0 | 86.0 | 10.42 | 0.05 |
| 95.5 | 10.0 | 85.5 | 10.47 | 0.05 |
| 100.0 | 10.5 | 89.5 | 10.50 | 0.03 |
| 99.5 | 10.5 | 89.0 | 10.55 | 0.05 |
| 99.0 | 10.5 | 88.5 | 10.61 | 0.05 |
| 98.5 | 10.5 | 88.0 | 10.66 | 0.05 |
| 98.0 | 10.5 | 87.5 | 10.71 | 0.05 |
| 100.0 | 20.0 | 80.0 | 20.00 | – |
| 99.5 | 20.0 | 79.5 | 20.10 | 0.10 |
| 99.0 | 20.0 | 79.0 | 20.20 | 0.10 |
| 98.5 | 20.0 | 78.5 | 20.30 | 0.10 |
| 98.0 | 20.0 | 78.0 | 20.41 | 0.10 |
| 100.0 | 20.5 | 79.5 | 20.50 | 0.09 |
| 99.5 | 20.5 | 79.0 | 20.60 | 0.10 |
| 99.0 | 20.5 | 78.5 | 20.71 | 0.10 |
| 98.5 | 20.5 | 78.0 | 20.81 | 0.11 |
| 98.0 | 20.5 | 77.5 | 20.92 | 0.11 |
| 100.0 | 21.0 | 79.0 | 21.00 | 0.08 |
| 99.5 | 21.0 | 78.5 | 21.11 | 0.11 |
| 99.0 | 21.0 | 78.0 | 21.21 | 0.11 |
| 98.5 | 21.0 | 77.5 | 21.32 | 0.11 |
| 98.0 | 21.0 | 77.0 | 21.43 | 0.11 |
| 100.0 | 45.0 | 55.0 | 45.00 | – |
| 99.5 | 45.0 | 54.5 | 45.23 | 0.23 |
| 100.0 | 45.5 | 54.5 | 45.50 | 0.27 |
| 99.5 | 45.5 | 54.0 | 45.73 | 0.23 |
| 100.0 | 46.0 | 54.0 | 46.00 | 0.27 |
| 99.5 | 46.0 | 53.5 | 46.23 | 0.23 |
| 100.0 | 46.5 | 53.5 | 46.50 | 0.27 |
| 99.5 | 46.5 | 53.0 | 46.73 | 0.23 |
| 100.0 | 47.0 | 53.0 | 47.00 | 0.27 |
| 99.5 | 47.0 | 52.5 | 47.24 | 0.24 |
| 100.0 | 47.5 | 52.5 | 47.50 | 0.26 |
| 99.5 | 47.5 | 52.0 | 47.74 | 0.24 |
| 100.0 | 48.0 | 52.0 | 48.00 | 0.26 |
| 99.5 | 48.0 | 51.5 | 48.24 | 0.24 |
| 100.0 | 48.5 | 51.5 | 48.5 | 0.26 |

FIG. 8

| PERIOD OF PWM SIGNAL [CLOCK PERIOD] | LOGIC "H" TIME OF PWM SIGNAL [CLOCK PERIOD] | LOGIC "L" TIME OF PWM SIGNAL [CLOCK PERIOD] | DUTY OF PWM SIGNAL [%] | DUTY CHANGE QUANTITY OF PWM SIGNAL [%] |
|---|---|---|---|---|
| 100.0 | 65.0 | 35.0 | 65.00 | - |
| 99.0 | 64.5 | 34.5 | 65.15 | 0.15 |
| 99.5 | 65.0 | 34.5 | 65.33 | 0.18 |
| 100.0 | 65.5 | 34.5 | 65.50 | 0.17 |
| 99.0 | 65.0 | 34.0 | 65.66 | 0.16 |
| 99.5 | 65.5 | 34.0 | 65.83 | 0.17 |
| 100.0 | 66.0 | 34.0 | 66.00 | 0.17 |
| 99.0 | 65.5 | 33.5 | 66.16 | 0.16 |
| 99.5 | 66.0 | 33.5 | 66.33 | 0.17 |
| 100.0 | 66.5 | 33.5 | 66.50 | 0.17 |
| 99.0 | 66.0 | 33.0 | 66.67 | 0.17 |
| 99.5 | 66.5 | 33.0 | 66.83 | 0.17 |
| 100.0 | 67.0 | 33.0 | 67.00 | 0.17 |
| 99.0 | 66.5 | 32.5 | 67.17 | 0.17 |
| 99.5 | 67.0 | 32.5 | 67.34 | 0.16 |
| 100.0 | 75.0 | 25.0 | 75.00 | - |
| 98.5 | 74.0 | 24.5 | 75.13 | 0.13 |
| 99.0 | 74.5 | 24.5 | 75.25 | 0.13 |
| 99.5 | 75.0 | 24.5 | 75.38 | 0.12 |
| 100.0 | 75.5 | 24.5 | 75.50 | 0.12 |
| 98.5 | 74.5 | 24.0 | 75.63 | 0.13 |
| 99.0 | 75.0 | 24.0 | 75.76 | 0.12 |
| 99.5 | 75.5 | 24.0 | 75.88 | 0.12 |
| 100.0 | 76.0 | 24.0 | 76.00 | 0.12 |
| 98.5 | 75.0 | 23.5 | 76.14 | 0.14 |
| 99.0 | 75.5 | 23.5 | 76.26 | 0.12 |
| 99.5 | 76.0 | 23.5 | 76.38 | 0.12 |
| 100.0 | 76.5 | 23.5 | 76.50 | 0.12 |
| 98.5 | 75.5 | 23.0 | 76.65 | 0.15 |
| 99.0 | 76.0 | 23.0 | 76.77 | 0.12 |
| 100.0 | 85.0 | 15.0 | 85.00 | - |
| 97.0 | 82.5 | 14.5 | 85.05 | 0.05 |
| 97.5 | 83.0 | 14.5 | 85.13 | 0.08 |
| 98.0 | 83.5 | 14.5 | 85.20 | 0.08 |
| 98.5 | 84.0 | 14.5 | 85.28 | 0.08 |
| 99.0 | 84.5 | 14.5 | 85.35 | 0.07 |
| 99.5 | 85.0 | 14.5 | 85.43 | 0.07 |
| 100.0 | 85.5 | 14.5 | 85.50 | 0.07 |
| 97.0 | 83.0 | 14.0 | 85.57 | 0.07 |
| 97.5 | 83.5 | 14.0 | 85.64 | 0.07 |
| 98.0 | 84.0 | 14.0 | 85.71 | 0.07 |
| 98.5 | 84.5 | 14.0 | 85.79 | 0.07 |
| 99.0 | 85.0 | 14.0 | 85.86 | 0.07 |
| 99.5 | 85.5 | 14.0 | 85.93 | 0.07 |
| 100.0 | 86.0 | 14.0 | 86.00 | 0.07 |

PWM SIGNAL GENERATING CIRCUIT AND POWER SUPPLY APPARATUS COMPRISING SUCH PWM SIGNAL GENERATING CIRCUIT

BACKGROUND OF THE INVENTION

1. Field of the Invention

The present invention relates to a PWM (Pulse Width Modulation) signal generating circuit, and a power supply apparatus comprising such a PWM signal generating circuit.

2. Background Art

In control of power supply apparatus, PWM (Pulse Width Modulation) signal has been conventionally used for adjustment of output power. In recent years, from the requirements of miniaturization, realization of high performance and realization of highly enhanced function of the apparatus, realization of digital control of power supply apparatuses is being developed in place of analog control systems which have been used from the old time.

In the digital control power supply apparatuses, there is conventionally used a method of generating a PWM signal by using a counter and a comparison circuit. Specifically, e.g., a clock signal is inputted to a counter to allow the counter to perform count-up operation to input this count value and a threshold value to a comparison circuit to compare them to thereby generate a PWM signal. When count value of the counter reaches a reset value which is set to a value greater than the threshold value, the counter is reset. By changing the threshold value, duty (logic "H" time ratio) of PWM signal is changed. By changing the reset value, the period of the PWM signal is changed.

However, with this method, even if the threshold value is changed by 1 (one) for the purpose of finely changing the duty, the logic "H" time of PWM signal is only changed by one clock period. Accordingly, since change of duty becomes large, it is impossible to finely control an output power of a power supply apparatus. As a result, it is impossible to prepare a high performance power supply apparatus. On the other hand, if a clock signal having a high frequency is utilized, it is possible to finely change duty. However, utilization of a clock signal having high frequency constitutes causes to increase the cost and to increase the power consumption of the power supply apparatus.

To solve such a problem, e.g., JP Patent Publication (Kokai) No. 2005-354854 A provides a duty control method for PWM signal in which change of duty is reduced without increasing clock frequency. Since the duty is changed by changing period of the PWM signal, it can be said that this control method is a control method of realizing a change of duty to finer degree as compared to the prior art (of improving resolution of PWM signal).

Moreover, JP Patent Publication (Kokai) No. 2004-32732 A discloses a PWM control circuit in which there is used a delay circuit for performing delay by time period which is only one half of clock period by utilizing a falling signal of clock to thereby realize change of logic "H" time of PWM signal by ½ clock period to improve resolution of PWM signal.

SUMMARY OF THE INVENTION

However, in the conventional PWM signal generating circuit disclosed in the JP Patent Publication (Kokai) No. 2005-354854 A, period of a PWM signal which can be changed is fundamentally only a time period corresponding to clock period. For this reason, in order to change period of a PWM signal at a time interval shorter than clock period, it is required to use a clock asynchronous delay circuit which does not depend on a clock signal. However, since the clock asynchronous delay circuit has the problems that there is unevenness from a manufacturing point of view of delay time and delay time is changed by temperature change, etc., there are instances where even if there is used the PWM signal generating circuit by the JP Patent Publication (Kokai) No. 2005-354854 A, accuracy of duty may be lowered.

Moreover, in the conventional PWM signal generating circuit disclosed in the JP Patent Publication (Kokai) No. 2004-32732 A, logic "H" time of a PWM signal which can be changed is fundamentally only one half of clock period. In order to change logic "H" time of PWM signal at a time interval shorter than ½ of clock period, it is required to use, similarly to the JP Patent Publication (Kokai) No. 2005-354854 A, clock asynchronous delay circuit which does not depend upon clock signal. Accordingly, even if the PWM signal generating circuit described in the JP Patent Publication (Kokai) No. 2004-32732 A is used, it is difficult to avoid lowering of accuracy of duty.

Accordingly, even if the technologies disclosed in these JP Patent Publication (Kokai) No. 2005-354854 A and JP Patent Publication (Kokai) No. 2004-32732 A are used, the minimum change width of duty which can be changed in the vicinity of duty 50% can be narrowed only by about one half. Namely, resolution of the duty is only improved about twice. If this is represented by binary number, it is concluded that resolution is improved only by about one bit. Moreover, in order to further improve resolution to a degree more than one bit without increasing clock frequency, it is required to use clock asynchronous delay circuit. As a result, there are instances where accuracy of duty may be lowered.

As stated above, in the conventional PWM signal generating circuits, there was the drawback that resolution can be improved at the best only by one bit in the vicinity of duty 50% in order to improve resolution of PWM signal without increasing clock frequency, and without using clock asynchronous delay circuit.

The present invention has been made in view of such circumstances, and provides a PWM signal generating circuit which can improve resolution of a PWM signal to be generated without increasing frequency of a clock signal for generating PWM signal, and a power supply apparatus comprising such a PWM signal generating circuit.

In order to solve the above-described problems, the PWM signal generating circuit of the present invention is directed to a PWM signal generating circuit for generating a PWM signal on the basis of a threshold value, which comprises a counter operative to perform count-up and/or count-down operations on the basis of a clock signal, and a comparison circuit operative to compare a count value of the counter and a threshold value to change an output level thus to change period of the PWM signal and the threshold value to change duty of the PWM signal. Further, the counter comprises a first counter for counting rising number of times of a clock signal, and a second counter for counting falling number of times of the clock signal, and is adapted so that both counters are permitted to be reset with 0.5 clock period being shifted in terms of time. Moreover, in connection with the above-described threshold value, when count value is smaller than the threshold value, logic "H" time of the PWM signal is set. When the count value is larger than the threshold value, logic "L" time is set. Further, the threshold value and a reset signal for resetting the counter are determined by a desired PWM signal. The condition of the desired PWM signal is given to the PWM control means as a duty setting signal. The contents of the threshold value (related to logic "H" time setting), the reset signal (related to the period of PWM signal), and the PWM signal output select signal are determined on the basis of the duty setting signal.

More specifically, the PWM signal generating circuit according to the present invention is directed to a PWM signal generating circuit operative to control duty of a PWM signal to generate a desired PWM signal, which comprises: counter means for counting the number of clocks on the basis of a clock signal; PWM signal output means operative to compare a count value of the counter means and a threshold value to change an output level to output a desired PWM signal; and PWM control means operative to change the period of the PWM signal and the threshold value on the basis of a duty setting signal determined from a desired PWM signal to be generated to control duty of a PWM signal that the PWM signal output means outputs. This counter means comprises a first counter for performing count operation on the basis of rising of a clock signal, and a second counter for performing count operation on the basis of falling of the clock signal.

The PWM control means serves to change period of PWM signal and/or threshold value (logic "H" time of PWM signal) by logic "H" time of clock signal and/or logic "L" time of clock signal.

Moreover, the PWM signal output means comprises a first comparison circuit operative to compare a count value of the first counter and the threshold value to change an output level, and a second comparison circuit operative to compare a count value of the second counter and the threshold value to change an output level.

The PWM control means serves to reset the first and second counters in response to a counter reset signal determined from a duty setting signal to make setting into respective initial values, or to alternately change respective operation time periods of the first and second counters to reset the first and second counters.

Moreover, the PWM control means serves to reset the second counter in response to falling of a clock signal immediately after it resets the first counter in response to rising of a clock signal. Alternatively, the PWM control means may reset the first counter in response to rising of a clock signal immediately after it resets the second counter in response to falling of a clock signal.

In more detail, in the case where the period of a desired PWM signal is N+($\frac{1}{2}$) clock period (N is natural number), the PWM control means serves to alternately repeat operation time periods of the first and second counters at N clock period and (N−1) clock period to reset the first and second counters. In this case, the PWM signal output means comprises: a first comparison circuit operative to compare a count value of the first counter and the threshold value to change an output level, a second comparison circuit operative to compare a count value of the second counter and the threshold value to change an output level, a logical sum element and/or a logical product element for generating a logical sum signal and/or a logical product signal of an output signal of the first comparison circuit and an output signal of the second comparison circuit, and selector means responsive to an output select signal determined from a duty setting signal to select either one of an output signal of the first comparison circuit, an output signal of the second comparison circuit and the logical sum signal and/or the logical product signal to output the signal thus selected. In the case where logic "H" time of a desired PWM signal is M+($\frac{1}{2}$) clock period (M is natural number), the PWM control means serves to set the threshold value to M, and to set, as an output select signal, a signal for selecting logical sum signal and/or logical product signal. Moreover, in the case where logic "H" time of a desired PWM signal is M clock period (M is natural number), the PWM control means serves to set the threshold value to M, and to set, as an output select signal, a signal for alternately selecting an output signal of the first comparison circuit and an output signal of the second output signal.

Further, in the case where the period of a desired PWM signal is N clock period (N is natural number), the PWM control means serves to both allow operation time periods of the first and second counters to be as (N−1) clock period to perform reset operation. In the case where logic "H" time of a desired PWM signal is M+($\frac{1}{2}$) clock period (M is natural number), the PWM control means serves to set the threshold value to M, and to set, as an output select signal, a signal for selecting the logical sum signal and/or the logical product signal. Moreover, in the case where logic "H" time of a desired PWM signal is M clock period (M is natural number), the PWM control means serves to set the threshold value to M, and to set, as an output select signal, a signal for selecting one of an output signal of the first comparison circuit and an output signal of the second comparison circuit.

Furthermore, the present invention also provides a power supply apparatus comprising the above-described PWM signal generating circuit. Namely, the power supply apparatus according to the present invention is directed to a power supply apparatus adapted for converting power between power supply lines, which comprises: a power supply circuit connected to plural power supply lines, and including a sensor and a switching element; clock signal generating means for generating a clock signal; control means connected to the sensor, and serving to determine duty of the switching element; and a PWM generating circuit connected to the control means and the switching element, wherein the PWM signal generating circuit is a PWM signal generating circuit for controlling duty of a PWM signal to generate a desired PWM signal, which comprises: counter means for counting the number of clocks on the basis of a clock signal; PWM signal output means operative to compare a count value of the counter means and a threshold value to change an output level to output a desired PWM signal, and PWM control means operative to change period of the PWM signal and the threshold value on the basis of a duty setting signal determined from the desired PWM signal to be generated to control duty of a PWM signal that the PWM signal output means outputs.

In addition, the power supply apparatus of another embodiment is directed to a power supply apparatus adapted for converting power between power supply lines, which comprises: a power supply circuit connected to plural power supply lines, and including a sensor and a switching element; clock signal generating means for generating a clock signal; and control means connected to the sensor and the switching element, and serving to determine duty of the switching element, wherein the control means includes a PWM signal generating circuit for controlling duty of the PWM signal to generate a desired PWM signal, the PWM signal generating circuit comprising: counter means for counting the number of clocks on the basis of a clock signal; PWM signal output means operative to compare a count value of the counter means and a threshold value to change an output level to output a desired PWM signal, and PWM control means operative to change period of the PWM signal and the threshold value on the basis of a duty setting signal determined from the desired PWM signal to be generated to control duty of a PWM signal that the PWM signal output means outputs. It is to be noted that the control means may be also constituted by a microprocessor or a programmable logic device comprising a PWM signal generating circuit.

Still further features of the present invention will become clear as below with reference to the detailed description of the present invention and the attached drawings.

In accordance with the PWM signal generating circuit of the present invention, it is possible to lower clock frequency while improving resolution of a PWM signal. Moreover, when such a PWM signal generating circuit is used for a power supply apparatus, it is possible to provide a power supply apparatus of which cost and power consumption have been reduced.

BRIEF DESCRIPTION OF THE DRAWINGS

FIG. 5 is a diagram indicating value of duty obtained when the duty of a PWM signal that the PWM signal generating circuit 1 according to the embodiment of the present invention outputs is changed within the range from 50% to 53%;

FIG. 6 is a diagram indicating value of duty obtained when duty of a PWM signal that conventional PWM signal generating circuit outputs is changed within the range from 50% to 53%;

FIG. 7 is a diagram showing abstracted values of duty obtained when the PWM signal generating circuit 1 according to the embodiment of the present invention outputs is changed within the range from 0% to 100%;

FIG. 8 is a diagram showing abstracted values of different duty obtained when duty of PWM signal that the PWM signal generating circuit 1 according to the embodiment of the present invention outputs is changed within the range from 0% to 100%;

DETAILED DESCRIPTION OF THE PREFERRED EMBODIMENTS

Figure 1:
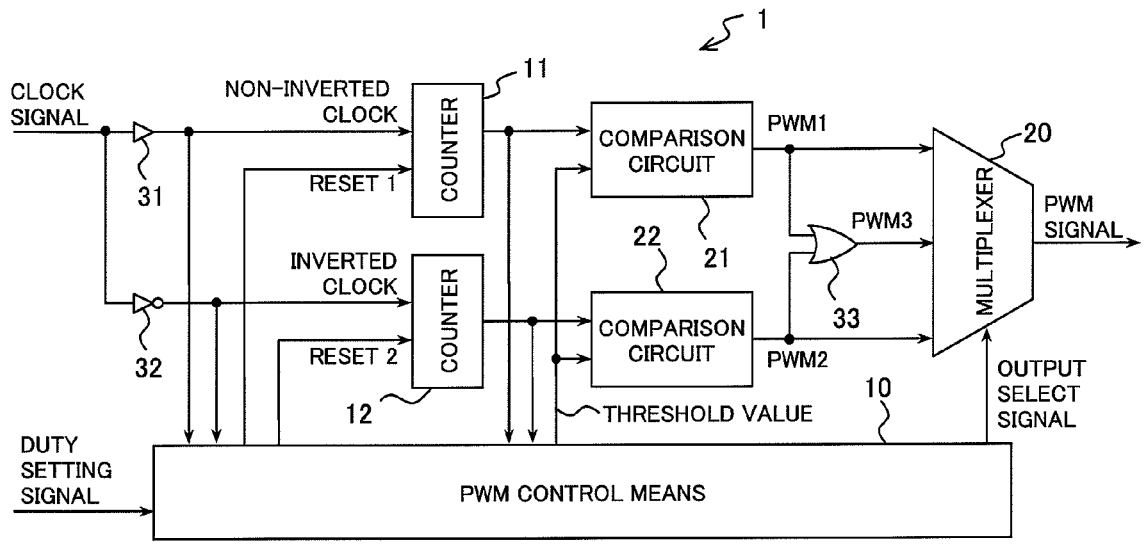
FIG. 1 is a diagram showing the configuration of PWM signal generating circuit 1 according to an embodiment of the present invention.

Preferred embodiments of the present invention will now be described in detail with reference to the attached drawings. It is to be noted that the same reference numerals are respectively attached to the same or corresponding parts in the drawings, and their descriptions are not repeated in principle. Moreover, description will be made on the assumption that duty is 50%.

<Configuration of PWM Signal Generating Circuit>

FIG. 1 is a diagram showing the configuration of a PWM signal generating circuit 1 according to an embodiment of the present invention. This PWM signal generating circuit 1 comprises counters 11, 12, comparison circuits 21, 22, and a multiplexer 20. These circuit elements are controlled by PWM control means 10. As other circuit elements, the PWM signal generating circuit 1 comprises a non-inverting element 31, an inverting element 32, and a logical sum element 33.

This PWM signal generating circuit 1 generates a PWM signal on the basis of a clock signal and a duty setting signal.

The non-inverting element 31 and the inverting element 32 are supplied with a clock signal, and respectively output a non-inverted clock signal and an inverted clock signal. The non-inverted clock signal and the inverted clock signal are respectively inputted to the counters 11 and 12, at which rising number of times are respectively counted. Accordingly, the counter 11 counts rising number of clock signals, and the counter 12 counts the falling number of times of the clock signal. These counters 11, 12 are respectively supplied with reset 1, 2 signals that the PWM control means outputs. Thus, the PWM control means 10 can individually reset count values of the counters 11, 12.

The count values of the counters 11, 12 are respectively inputted to comparison circuits 21, 22. The comparison circuits 21, 22 are supplied with a threshold value that the PWM control means 10 has outputted. The comparison circuit 21 compares a count value of the counter 11 and the threshold value to output a PWM 1 signal. The comparison circuit 22 compares a count value of the counter 12 and the threshold value to output a PWM 2 signal. The logical sum element 33 receives, as inputs, the PWM 1 signal and the PWM 2 signal to output a PWM 3 signal which is logical sum of the PWM 1 signal and the PWM 2 signal.

The multiplexer 20 is supplied with PWM 1, 2, 3 signals, and an output select signal that the PWM control means 10 has outputted. The multiplexer 20 selects one signal from the PWM 1, 2, 3 signals on the basis of an output select signal to output the signal thus selected. An output signal of the multiplexer 20 provides a PWM signal that the PWM signal generating circuit 1 outputs.

The PWM control means 10 is supplied with a duty setting signal, a non-inverted clock signal, an inverted clock signal, a count value of the counter 11, and a count value of the counter 12. The PWM control means 10 outputs, on the basis of these input signals, reset 1, 2 signals for resetting the counters 11, 12, the threshold value inputted to the comparison circuits 21, 22, and an output select signal inputted to the multiplexer 20.

<Operation of the PWM Signal Generating Circuit>

Figure 3:
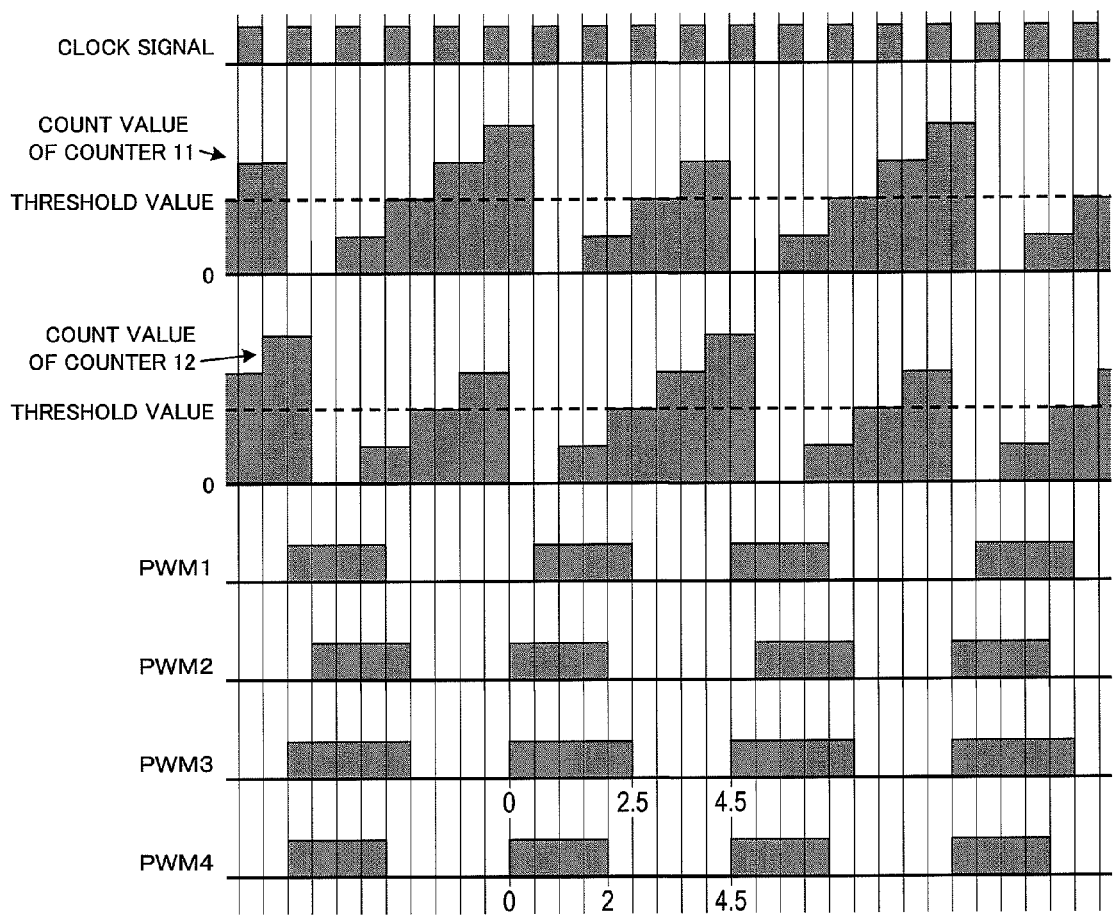
FIG. 3 is a waveform diagram for explaining the first operation example of the PWM signal generating circuit 1 according to the embodiment of the present invention.
Figure 4:
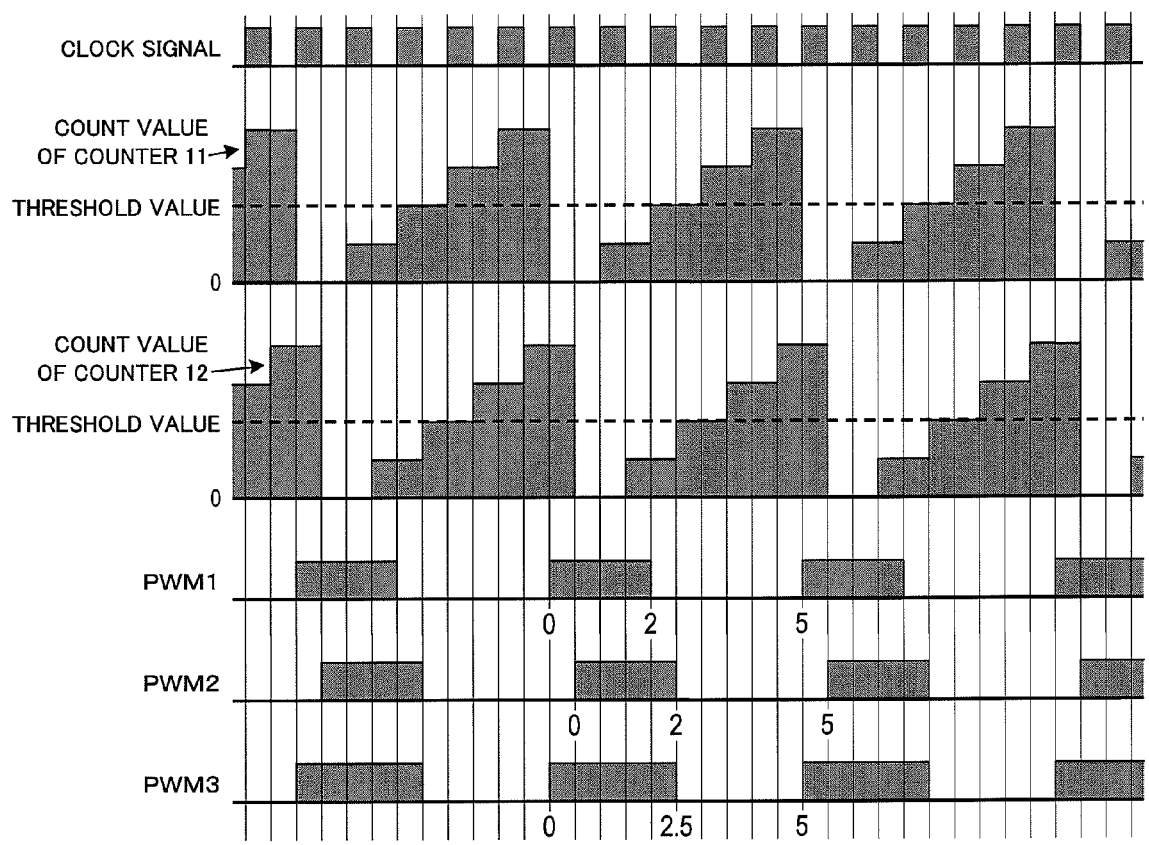
FIG. 4 is a waveform diagram for explaining the second operation example of the PWM signal generating circuit 1 according to the embodiment of the present invention.

FIGS. 3 and 4 are waveform diagrams for explaining operation examples of the PWM signal generating circuit 1 according to the embodiment of the present invention. As understood from the description given below, if, e.g., a method shown in FIGS. 3 and 4 is employed, it is possible to also operate ON time in a PWM signal by 0.5 clock period. Thus, it is possible to finely change both duty and period of a PWM signal as shown in FIG. 5. Accordingly, it is possible to improve resolution of the PWM signal.

(First Example of the Circuit Operation)

The first example of the circuit operation of the PWM signal generating circuit 1 according to the embodiment of the present invention will be described in detail with reference to FIG. 3.

In FIG. 3, the counters 11, 12 are constituted as up-counter. It is assumed that when threshold value is larger than count values of the counters 11, 12, the comparison circuits 21, 22 output logic "H". Here, the threshold value is set to 2 (two). The threshold value, the reset signals 1 and 2, and the output select signal are determined by the duty setting signal. A determination thereof will be described later. Moreover, the counter 11 is a counter to perform count-up operation by one in response to rising of a clock signal, and the counter 12 is a counter to perform count-up operation by one in response to falling of a clock signal.

When the count value of the counter 11 reaches 4 (four), the count value is reset to 0 (zero) in response to rising of a next clock signal by reset 1 signal which has been inputted from the PWM control means 10. From rising of a next clock signal, the counter 11 performs count-up operation by one for a second time. Next, when the count value reaches 3 (three), the PWM control means 10 sends reset 1 signal. Thus, the count value is reset to 0 (zero) in response to rising of a next clock signal. From rising of a next clock signal, the counter 11 performs count-up operation by 1 (one) for a second time. The counter 11 repeats such an operation. Namely, the counter 11 alternately repeats an operation in which count operation is performed until 4 (four) so that the count value is reset, and an operation in which count operation is performed until 3 (three) so that the count value is reset.

Similarly to the counter 11, the counter 12 alternately repeats an operation in which count operation is performed until 4 (four) so that the count value is reset, and an operation in which count operation is performed until 3 (three) so that the count value is reset. It is to be noted that the count-up operation and the reset operation of the counter 12 are based on falling of clock signal.

Moreover, with respect to timings at which the counters 11 and 12 are reset, there is a rule as described below. In response to falling of a clock signal immediately after the counter 11 counts up to 3 (three) so that the count value is reset, the counter 12 is reset in the state where the count value of the counter 12 is 4 (four). Similarly, in response to rising of a clock signal immediately after the counter 12 counts up to 3 (three) so that the count value is reset, the counter 11 is reset in the state where the count value of the counter 11 is 4 (four). Further, since the counter 11 is reset in response to rising of a clock signal and the counter 12 is reset in response to falling of a clock signal, even if reset periods of both counters are the same, the timing of reset is shifted in terms of time by 0.5 clock period. Accordingly, the logic "H" time and the logic "L" time of the PWM signal, and the period of the PWM signal can be realized by small value such as 2.5 clock period, or 4.5 clock period, etc.

The comparison circuit 21 compares a count value of the counter 11 and the threshold value. As a result, when the threshold value is larger than the count value of the counter 11, the comparison circuit 21 outputs logic "H". On the other hand, when the threshold value is smaller than or is equal to the count value of the counter 11, the comparison circuit 21 outputs logic "L". An output signal of the comparison circuit 21 is caused to be PWM 1 signal.

Similarly to the comparison circuit 21, the comparison circuit 22 compares a count value of the counter 12 and the threshold value. As a result, when the threshold value is larger than the count value of the counter 12, the comparison circuit 22 outputs logic "H". On the other hand, when the threshold value is smaller than or equal to the count value of the counter 12, the comparison circuit 22 outputs logic "L". Further, an output signal of the comparison circuit 22 is caused to be PWM 2 signal.

The logical sum element 33 inputs the PWM 1 signal and the PWM 2 signal to output a PWM 3 signal which is logical sum of the PWM 1 signal and the PWM 2 signal.

PWM 1, 2, 3 signals and an output select signal that the PWM control means 10 has outputted are inputted to the multiplexer 20. The multiplexer 20 selects one signal from the PWM 1, 2, 3 signals on the basis of the output select signal to output the signal thus selected. An output signal of the multiplexer 20 constitutes a PWM signal that the PWM signal generating circuit 1 outputs.

In this case, if the PWM 3 signal is selected, logic "H" time of a PWM signal that the PWM signal generating circuit 1 outputs is 2.5 clock period. Moreover, if pulse of the PWM 1 signal and pulse of the PWM 2 signal are alternately selected, waveform labeled PWM 4 in FIG. 3 is provided. As a result, the logic "H" time of the PWM signal that the PWM signal generating circuit 1 outputs becomes 2 clock period. In this case, periods of the PWM 3 signal and PWM 4 signal are both 4.5 clock period, and the period of a PWM signal that the PWM signal generating circuit 1 output becomes 4.5 clock period. As stated above, if the PWM 3 signal or PWM 4 signal is selected, it becomes possible to improve resolution of the PWM signal in the state where the clock frequency is maintained as it is.

(Second Example of the Circuit Operation)

The second operation example of the PWM signal generating circuit 1 according to the embodiment of the present invention will now be described in detail with reference to FIG. 4.

In FIG. 4, the counters 11, 12 are constituted as up-counters. Moreover, when the threshold value is larger than count values of the counters 11, 12, the comparison circuits 21, 22 output logic "H". Also in the second operation example, similarly to the first operation example, the threshold value is 2 (two). Further, similarly to the first operation example, the counter 11 performs count-up operation by one in response to rising of a clock signal, and the counter 12 performs count-up operation by one in response to falling of a clock signal.

When the count value of the counter 11 reaches 4 (four), the count value of the counter 11 is reset to 0 (zero) in response to rising of a next clock signal by a reset 1 signal inputted from the PWM control means 10. From rising of a next clock signal, the counter 11 performs count-up operation by 1 (one) for a second time. The counter 11 repeats such an operation. Namely, the counter 11 repeats an operation in which count operation is performed until 4 (four) so that the count value is reset.

Similarly to the counter 11, the counter 12 repeats an operation in which count operation is performed until 4 (four) so that the count value is reset. It is to be noted that the count-up operation and the reset operation of the counter 12 are based on falling of the clock signal.

Moreover, with respect to timings at which the counters 11 and 12 are reset, there exists the rule that the counter 12 is reset in response to falling of a clock signal immediately after the counter 11 is reset.

Since the operations of the comparison circuits 21, 22, the logical sum element 33 and the multiplexer 20 are similar to those of the first operation example of the previously described PWM signal generating circuit 1, their detailed description will be omitted.

When PWM 3 signal is selected as an output signal of the multiplexer 20, logic "H" time of PWM signal that the PWM signal generating circuit 1 outputs becomes 2.5 clock period. Moreover, when the PWM 1 signal or the PWM 2 signal is selected, logic "H" time of a PWM signal that the PWM signal generating circuit 1 outputs becomes 2 clock period. It is to be noted that even if either one of PWM 1, 2, 3 signals is selected, period of a PWM signal that the PWM signal generating circuit 1 outputs becomes 5 clock period.

The operation common to the first operation example and the second operation example will now be described. The PWM control means 10 suitably outputs reset 1, 2 signals for resetting counters 11, 12, a threshold value inputted to comparison circuits 21, 22, and an output select signal inputted to the multiplexer 20 on the basis of inputted duty setting signal, a non-inverted clock signal, an inverted clock signal, a count value of the counter 11, and a count value of the counter 12 to thereby control duty and period of a PWM signal that the PWM signal generating circuit 1 outputs. In a practical sense, the threshold value and a count value when the counter is reset may be changed to perform switching between the first operation example and the second operation example, thereby making it possible to change duty and period of a PWM signal that the PWM signal generating circuit 1 outputs.

Since the operation in the case where the threshold value and a count value when the counter is reset are different from those of FIGS. 3 and 4 can be analogized from the previously described operation description, the description thereof will be omitted.

As stated above, in the PWM signal generating circuit 1 according to the embodiment of the present invention, it is possible to arbitrarily change both the period and logic "H" time of a PWM signal to be outputted at time interval which is one half of the clock period. It should be noted that attention should be drawn to the fact that logic "H" time and logic "L" time of a clock signal are equal to each other as the premise for changing the period and the logic "H" time at time interval of one half of the clock period, in other words, duty of the clock signal is 50%.

It is to be noted that while reset timings of the counters 11 and 12 are prescribed in the description of the previously described operation examples, those counters may be operated at reset timing different from that of the previously described operation example.

Moreover, while reset operations of the counters 11 and 12 have been described in the previously described operation examples, those reset operations in the previously described operation examples may be an operation for setting an arbitrary initial value.

Even if the logical sum element 33 is changed into a logical product element, it is possible to provide an effect similar to that of the previously described operation example. Moreover, switching between selection of the PWM 1 signal and selection of the PWM 2 signal may be performed for a time period during which an output of multiplexer 20 is logic "H", thereby making it possible to omit the logical sum element 33 thus to omit the PWM 3 signal.

Figure 2:
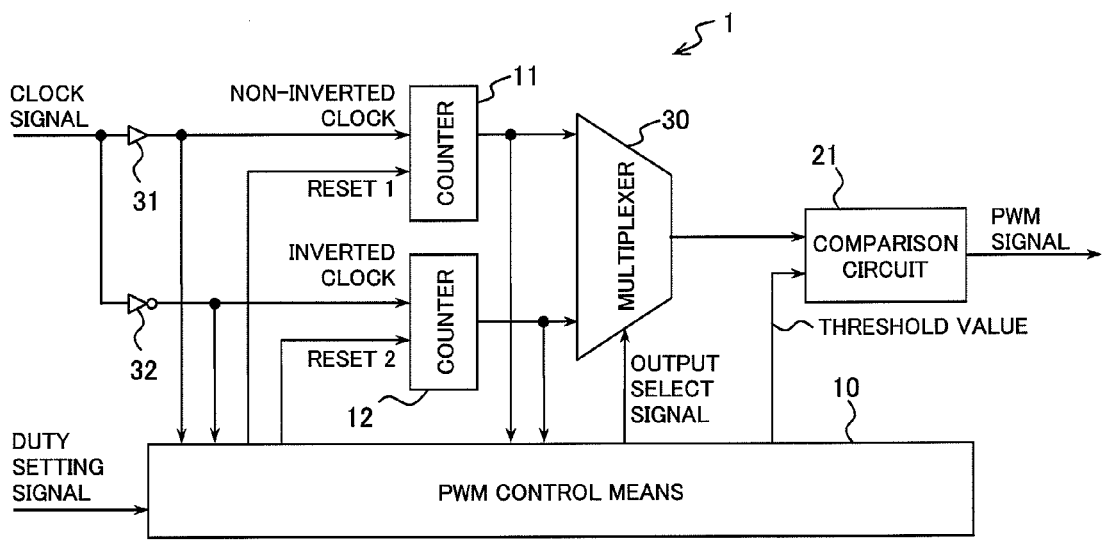
FIG. 2 is a diagram showing a simplified configuration of the PWM signal generating circuit 1 according to an embodiment of the present invention.

It should be noted that the PWM signal generating circuit 1 of the present invention shown in FIG. 1 may be simplified to provide a configuration shown in FIG. 2. In FIG. 2, a multiplexer 30 performs switching between a count value of the counter 11 and a count value of the counter 12 as a count value to be compared with the threshold level at the comparison circuit. The PWM control means 10 outputs an output select signal of the multiplexer 30 at a suitable timing to thereby have ability to arbitrarily change, at time interval which is one-half of the clock period, both the period and the logic "H" time of a PWM signal that the PWM signal generating circuit 1 shown in FIG. 2 outputs, similarly to the PWM signal generating circuit 1 shown in FIG. 1, (in a manner as previously described as the premise condition of clock signal) thus to have ability to omit either one of the comparison circuits 21, 22 and the logical sum element 33 in FIG. 1.

<Operation of PWM Control Means 10>

As described above, a duty setting signal, a non-inverted clock signal, an inverted clock signal, a count value of the counter 11, and a count value of the counter 12 are inputted to the PWM control means 10. The PWM control means 10 outputs, on the basis of these input signals, reset 1, 2 signals for resetting the counters 11, 12, a threshold value inputted to the comparison circuits 21, 22, and an output select signal inputted to the multiplexer 20. The operation of the PWM control means 10 will now be described in detail.

The duty setting signal includes information necessary for determining duty of a PWM signal that the PWM signal generating circuit 1 according to the embodiment of the present invention outputs. Description will now be made on the assumption that the duty setting signal includes information of period and logic "H" time of a PWM signal that the PWM signal generating circuit 1 outputs, and its resolution is ½ clock period.

The PWM control means 10 determines, in a manner described below, reset 1, 2 signals, the threshold value and the output select signal from the period and the logic "H" time of an inputted PWM signal (the condition of a desired PWM signal). In this case, N and M are assumed to be natural number. Moreover, count values when the reset 1, 2 signals are outputted, i.e., count values immediately before the counters 11, 12 are reset are respectively called reset values of the counters 11, 12.

(1) First, in the case where PWM period=N+(½) clock period (first example of the circuit operation), reset values of the counters 11, 12 are set in such a manner that N and (N−1) are alternately repeated.

(i) The case where PWM logic "H" time=M+(½) clock period

The threshold value is set to M. Further, as an output select signal, a signal for selecting the PWM 3 signal is outputted from the PWM control means 10.

(ii) The case where PWM logic "H" time=M clock period

The threshold value is set to M. As an output select signal, a signal for alternately selecting the PWM 1 signal and the PWM 2 signal is outputted from the PWM control means 10.

(2) Moreover, in the case where PWM period=N clock period (second example of the circuit operation), setting is made such that reset values of the counters 11, 12 are both (N−1).

(i) The case where PWM logic "H" time=M+(½) clock period

The threshold value is set to M. As an output select signal, a signal for selecting the PWM 3 signal is outputted from the PWM control means 10.

(ii) The case where PWM logic "H" time=M clock period

The threshold value is set to M. As an output select signal, a signal for selecting one of the PWM 1 signal and the PWM 2 signal is outputted from the PWM control means 10.

As stated above, by determining period and logic "H" time of a desired PWM signal, either one of the case (1) (i) & (ii) and the case (2) (i) & (ii) is determined. Further, the PWM control means 10 executes, on the basis of the above determination, a corresponding operation of the case (1) (i) & (ii) and the case (2) (i) & (ii). Thus, the PWM signal generating circuit 1 can arbitrarily change both period and logic "H" time of a PWM signal to be outputted at time interval of one half of the clock period (the condition as previously described is employed as the premise condition of clock signal).

<Effect by the PWM Signal Generating Circuit 1: Technical Meaning>

The effect (technical meaning) in the case where both period and logic "H" time of a PWM signal that the PWM signal generating circuit 1 according to the embodiment of the present invention outputs are suitably controlled will now be described with reference to FIGS. 5 and 8.

(1) FIG. 5 shows period, logic "H" time, logic L" time, duty and duty change quantity of a PWM signal in the case where duty of a PWM signal that the PWM signal generating circuit 1 according to this embodiment outputs is gradually changed from 50% to 53%, and FIG. 6 shows period, logic "H" time, logic "L" time, duty and duty change quantity of a PWM signal in the case where duty of a PWM signal that the PWM signal generating circuit conventionally used outputs is gradually changed from 50% to 53%.

As apparent from FIG. 6, it is understood that duty change quantity of a PWM signal that the conventional PWM signal generating circuit outputs is given by inverse number of period of a PWM signal in which "clock period" is used as unit. On the other hand, as apparent from FIG. 5, duty change quantity of a PWM signal that the PWM signal generating circuit 1 according to this embodiment outputs is smaller than inverse number of period of a PWM signal using "clock period" as unit.

Accordingly, as is clear from comparison between FIG. 5 and FIG. 6, it is understood that the PWM signal generating circuit 1 according to this embodiment can control duty of a PWM signal to be outputted in a manner finer than that of the conventional PWM signal generating circuit.

Moreover, from FIGS. 5 and 6, it is understood that when period in which unit of a PWM signal that the PWM signal generating circuit outputs is caused to be "clock period" is elongated, it is possible to finely control duty of PWM signal. However, since the period of an actual PWM signal in which the unit is caused to be, e.g., "sec." undergoes limitation by use, there are many cases where such period cannot be so elongated. For example, in a power supply apparatus in which PWM signal is employed as a switching command, when the period of the PWM signal is elongated, frequency of the PWM signal is lowered. For this reason, the switching frequency of the power supply apparatus is lowered so that coil and capacitor for smoothing voltage or current would be required to be enlarged. As a result, the power supply apparatus becomes large. Accordingly, in order to finely control duty of a PWM signal that the conventional PWM signal generating circuit outputs, it is necessary to shorten the period of a clock signal, i.e., to increase frequency of a clock signal. This constitutes causes to increase power consumption, and to increase the cost.

However, as apparent also from FIG. 5, in accordance with the PWM signal generating circuit 1 according to this embodiment, it is possible to control duty of a PWM signal to be outputted in a manner finer than that of the conventional PWM signal generating circuit without increasing frequency of the clock signal, and without elongating the period of a PWM signal to be outputted.

(2) FIGS. 7 and 8 show, in an abstracted manner, period, logic "H" time, logic "L" time, duty and duty change quantity of a PWM signal in the case where duty of a PWM signal that the PWM signal generating circuit 1 according to this embodiment outputs is gradually changed from 0% to 100%.

As described above, the PWM signal generating circuit 1 according to this embodiment can arbitrarily change both period and logic "H" time of a PWM signal to be outputted at time interval of one half of the clock period (the condition as previously described is employed as the premise condition of a clock signal). As apparent from FIGS. 7 and 8, when both period and logic "H" time of a PWM signal to be outputted are suitably controlled, it is possible to control duty with high resolution within a broad duty range. Moreover, according as duty becomes close to 0% or 100%, it is possible to perform a control with higher resolution.

As previously described, duty change quantity of a PWM signal that the conventional PWM signal generating circuit shown in FIG. 6 outputs is given by inverse number of period of a PWM signal in which unit is caused to be "clock period". On the contrary, the duty change quantity of a PWM signal that the PWM signal generating circuit 1 according to this embodiment shown in FIGS. 5, 7 and 8 outputs can be further reduced to a degree lesser than one half as compared to inverse number of period of PWM signal in which unit is caused to be "clock period". For example, referring to FIG. 7, it is understood that the PWM signal is permitted to have resolution of 1/20 (0.05/1) as compared to the conventional PWM signal generating circuit (see FIG. 6).

Accordingly, the PWM signal generating circuit 1 of this embodiment can improve resolution of duty of a PWM signal to be outputted to a degree more than one bit within a broad duty range. Particularly, duty change quantity in the case where duty is about 20% or less, or in the case where duty is about 80% or more can be further reduced to a value smaller than $1/8(=1/2^3)$ as compared to inverse number of period of a PWM signal in which the unit is caused to be [clock period]. Thus, the PWM signal generating circuit 1 of this embodiment can improve resolution of duty of a PWM signal to be outputted to a degree larger than three bits within the duty range where the duty is about 20% or less or about 80% or more.

<Applied Example of PWM Signal Generating Circuit 1>

Subsequently, a power supply apparatus comprising PWM signal generating circuit which has been described above will be described.

Figure 9:
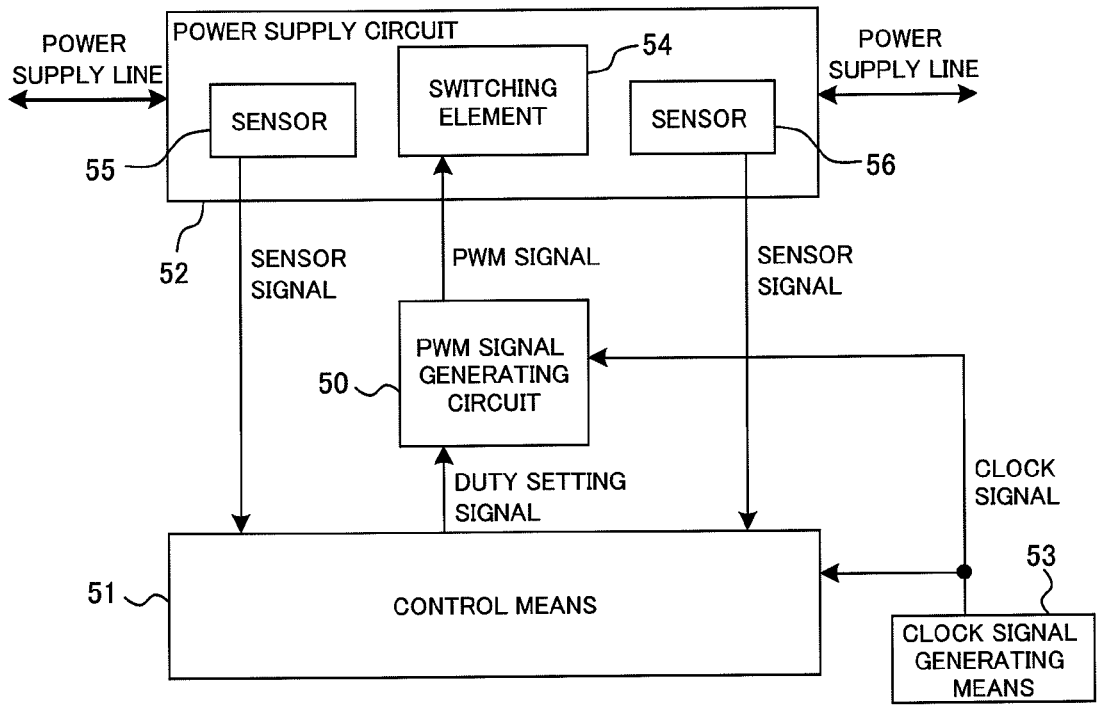
FIG. 9 is a diagram showing outline of the configuration of a power supply apparatus according to the present invention.
Figure 10:
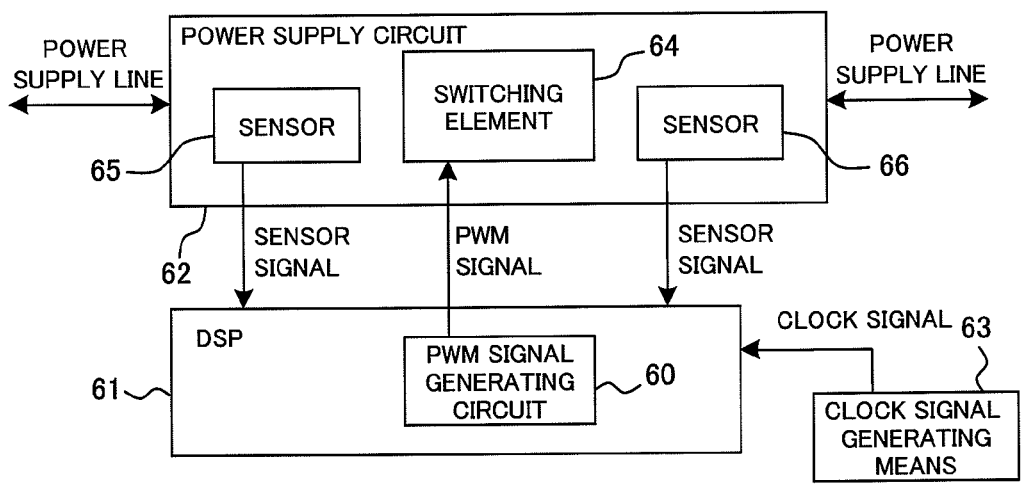
FIG. 10 is a diagram showing outline of the configuration of another power supply apparatus according to the present invention.

FIGS. 9 and 10 are diagrams showing outline of the configurations of power supply apparatuses each comprising PWM signal generating circuit according to the present invention.

In FIG. 9, a power supply circuit 52 connected between plural power supply lines and serving to convert power between the power supply lines includes sensors 55, 56 for measuring voltage and current, and a switching element 54 operative to repeat ON and OFF in order to convert power. A clock signal that a clock signal generating means 53 generates is delivered to control means 51 and a PWM signal generating circuit 50 according to the present invention.

The control means 51 receives sensor signals that the sensors 55, 56 have outputted to deliver a suitable duty setting signal to the PWM signal generating circuit 50 in order that the power supply apparatus according to the present invention suitably converts power. The PWM signal generating circuit 50 delivers, to the switching element 54, a PWM signal generated on the basis of the duty setting signal and the clock signal which have been inputted. The switching element 54 repeats ON and OFF on the basis of the PWM signal, and the power supply circuit 52 converts power between plural power supply lines.

It is to be noted that the PWM signal generating circuit 50 may be also constituted by using PLD (Programmable Logic Device) such as FPGA (Field Programmable Gate Array), etc.

In FIG. 10, similarly to FIG. 9, a power supply circuit 62 connected between plural power supply lines and serving to convert power between the power supply lines includes sensors 65, 66 for measuring voltage and current, and a switching element 64 operative to repeat ON and OFF in order to convert power. A clock signal that the clock signal generating means 63 has generated is delivered to a DSP 61. Here, the DSP 61 is abbreviated name of Digital Signal Processor. The DSP 61 is adapted so that the PWM signal generating circuit 60 according to the present invention is mounted therewithin.

The DSP 61 receives sensor signals that the sensors 65, 66 have outputted to deliver a PWM signal of a suitable duty to the switching element 64 by using the PWM signal generating circuit 60 in order that the power supply apparatus according to the present invention suitably converts power. The switching element 64 becomes operative to repeat ON and OFF on the basis of a PWM signal, and the power supply circuit 62 converts power between plural power supply lines.

It is to be noted that there may be used microprocessor except for DSP, and/or PLD (Programmable Logic Device) such as FPGA (Field Programmable Gate Array), etc.

Since the power supply apparatuses shown in FIGS. 9 and 10 include PWM signal generating circuits 1 according to the embodiments (labeled "50" in FIG. 9, and labeled "60" in FIG. 10), it is possible to finely control an output power within a broad output power range without increasing frequency of the clock signal and without lowering the switching frequency.

It should be noted that if the PWM signal generating circuits 1 according to the embodiments shown in FIGS. 1 and 2 use a clock asynchronous delay circuit in combination, it also becomes possible to more finely control duty of a PWM signal to be outputted. For example, it is apparent from the waveform diagrams shown in FIGS. 3 and 4 that if the non-inverting element 31 and/or the inverting element 32 are constituted by clock asynchronous delay circuit capable of controlling delay time to control a phase difference between non-inverted clock signal and inverted clock signal, it is possible to control logic "H" time of a PWM signal that the PWM signal generating circuit outputs to a degree finer than $\frac{1}{2}$ clock period.

<Summary>

The PWM signal generating circuits according to the embodiments are directed to a circuit operative to control duty of a PWM signal to generate a desired PWM signal, which comprises: counter means for counting the number of clocks on the basis of a clock signal; PWM signal output means operative to compare a count value of the counter means and a threshold value to change an output level to output a desired PWM signal; and PWM control means operative to change period of the PWM signal and the threshold value on the basis of a duty setting signal determined from a desired PWM signal to be generated to control duty of the PWM signal that the PWM signal output means outputs. The counter means comprises first counter for performing count operation on the basis of rising of a clock signal, and a second counter for performing count operation on the basis of falling of the clock signal. Moreover, the duty setting signal is determined from period and logic "H" time of a desired PWM signal. By constituting such a circuit, it is possible to improve resolution of PWM signal to a degree higher than about one bit in the vicinity of duty 50% without increasing the clock frequency, and without using clock asynchronous delay circuit.

Moreover, the PWM control means serves to change period and/or threshold value of a PWM signal (logic "H" time of a PWM signal) by logic "H" time of clock signal and/or logic "L" time of clock signal. Thus, it is possible to finely set resolution of a PWM signal to be generated.

As an embodiment of the PWM signal output means, PWM signal output means may comprises: selector means responsive to an output select signal determined from a duty setting signal to select either one of a count value of the first counter and a count value of the second counter; and a comparison circuit for comparing a threshold value and the selected count value. Alternatively, the PWM signal output means may comprise a first comparison circuit operative to compare a count value of the first counter and a threshold value to change an output level, and a second comparison circuit operative to compare a count value of the second counter and the threshold value to change an output level. As stated above, as the embodiment of means for outputting a PWM signal, there are conceivable at least two embodiments. Accordingly, although the configuration of the PWM signal output means is not limited to a specified one configuration, if the configurations of FIGS. 1 and 2 illustrated in the embodiments are used, it is possible to realize PWM signal output means with a simple configuration.

As stated above in the embodiments, the PWM control means serves to reset the first and second counters in response to a counter reset signal determined from a duty setting signal to make setting into respective initial values. Thus, it is possible to set logic "H" time of a PWM signal. As the mode for reset operation, in the embodiment, operation time periods of the first and second counters may be alternately changed to perform reset operation, the second counter may be reset in response to falling of a clock signal immediately after the first counter is reset in response to rising of clock signal, or the first counter may be reset in response to rising of a clock signal immediately after the second counter is reset in response to falling of a clock signal. Further, there may be performed an operation to reset the second counter in response to falling of a clock signal immediately after the first counter is reset in response to rising of the clock signal to reset the first counter in response to rising of clock signal immediately after the second counter is reset. Thus, it becomes possible to comply with settings of various logic "H" times of PWM signal.

In more detail, and in a general expression, in the case where period of a desired PWM signal is N+($\frac{1}{2}$) clock period (N is natural number), the PWM control means alternately repeats operation time periods (here, the time period which does not indicate initial value "0" of the counter is defined as an operation time period) of the first and second counters at N clock period and (N−1) clock period to perform reset operation. Further, in the case where logic "H" time of a desired PWM signal is M+($\frac{1}{2}$) clock period (M is natural number), the PWM control means sets the threshold value to M, and sets, as an output select signal, a logical sum signal and/or a logical product signal (PWM signal 3). Moreover, in the case where logic "H" time of a desired PWM signal is M clock period (M is natural number), the PWM control means sets the threshold value to M, and sets, as an output select signal, a signal for alternately selecting an output signal (PWM signal 1) of the first comparison circuit and an output signal (PWM signal 2) of the second comparison circuit.

Moreover, in the case where the period of a desired PWM signal is N clock period (N is natural number), the PWM control means serve to both allow operation time periods (here, time period which does not indicate initial value "0" of the counter is defined as an operation time period) of the first and second counters to be as (N−1) clock period to perform reset operation thereof. Further, in the case where logic "H" time of a desired PWM signal is M+($\frac{1}{2}$) clock period (M is natural number), the PWM control means sets the threshold value to M, and sets, as an output select signal, a signal for selecting logical sum signal and/or logical product signal (PWM signal 3). In the case where logic "H" time of a desired PWM signal is M clock period (M is natural number), the PWM control means sets the threshold value to M, and sets, as an output select signal, a signal for selecting one of an output signal (PWM signal 1) of the first comparison circuit and an output signal (PWM signal 2) of the second comparison circuit.

By providing the configurations as stated above, in accordance with the PWM generating circuit of the embodiments, it is possible to improve resolution of a PWM signal to a degree higher than one bit in the vicinity of duty 50% without increasing clock frequency, and without using clock asynchronous delay circuit. Moreover, it is possible to improve the resolution of PWM signal within a broad duty range.

Further, the power supply apparatus comprising PWM signal generating circuit as stated above is realized, thereby making it possible to provide a power supply apparatus in which fine control of output power has been attained within a broad output power range. In addition, since the clock frequency can be lowered while improving resolution of PWM signal, it is possible to provide a power supply apparatus in which the cost and the power consumption have been reduced.

What is claimed is:

1. A PWM signal generating circuit operative to control duty of a PWM signal to generate a desired PWM signal, comprising:
    counter means for counting the number of clocks on the basis of a clock signal;
    PWM signal output means for comparing a count value of the counter means and a threshold value to change an output level to output the desired PWM signal; and
    PWM control means operative to change period of the PWM signal and the threshold value on the basis of a duty setting signal determined from the desired PWM signal to be generated to control duty of the PWM signal that the PWM signal output means outputs; and
    wherein the counter means comprises a first counter for performing count operation on the basis of rising of the clock signal, and a second counter for performing count operation on the basis of falling of the clock signal.

2. The PWM signal generating circuit according to claim 1, wherein the duty setting signal is determined from period and logic "H" time of the desired PWM signal.

3. The PWM signal generating circuit according to claim 1, wherein the PWM control means changes the period and/or the logic "H" time of the PWM signal by the logic "H" time of the clock signal and/or logic "L" time of the clock signal.

4. The PWM signal generating circuit according to claim 1, wherein the PWM signal output means comprises selector means responsive to an output select signal determined from the duty setting signal to select either one of a count value of the first counter and a count value of the second counter, and a comparison circuit for comparing the threshold value and the selected count value.

5. The PWM signal generating circuit according to claim 1, wherein the PWM signal output means comprises a first comparison circuit for comparing a count value of the first counter and the threshold value to change an output level, and a second comparison circuit for comparing a count value of the second counter and the threshold value to change an output level.

6. The PWM signal generating circuit according to claim 5, further comprising selector means responsive to an output select signal determined from the duty setting signal to select either one of an output signal of the first comparison circuit and an output signal of the second comparison circuit to output the output signal thus selected.

7. The PWM signal generating circuit according to claim 5, wherein the PWM signal output means further comprises:
    a logical sum element and/or a logic product element for generating a logical sum signal and/or a logical product signal of an output signal of the first comparison circuit and an output signal of the second comparison circuit; and
    selector means responsive to an output select signal determined from the duty setting signal to output either one of the output signal of the first comparison circuit, the output signal of the second comparison circuit, and the logical sum signal and/or the logical product signal to output the signal thus selected.

8. The PWM signal generating circuit according to claim 1, wherein the PWM control means responds to a counter reset signal determined from the duty setting signal to reset the first and second counters to set each of the first and second counters to make setting into respective initial values.

9. The PWM signal generating circuit according to claim 8, wherein the PWM control means alternately changes respective operation time periods each serving as a time period which does not indicate the initial value of each of the first and second counters to perform reset operation thereof.

10. The PWM signal generating circuit according to claim 9, wherein in the case where period of the desired PWM signal is N+(½) clock period (N is natural number), the PWM control means alternately repeats operation time periods of the first and second counters at N clock period and (N−1) clock period to perform reset operation thereof.

11. The PWM signal generating circuit according to claim 10, wherein the PWM signal output means comprises:
    a first comparison circuit for comparing a count value of the first counter and the threshold value to change an output level;
    a second comparison circuit for comparing a count value of the second counter and the threshold value to change an output level;
    a logical sum element and/or a logical product element for generating a logical sum signal and/or a logical product signal of an output signal of the first comparison circuit and an output signal of the second comparison circuit; and
    selector means responsive to an output select signal determined from the duty setting signal to select either one of an output signal of the first comparison circuit, an output signal of the second comparison circuit, and the logical sum signal and/or the logical product signal,
    whereby in the case where logic "H" time of the desired PWM signal is M+(½) clock period (M is natural number), the PWM control means sets the threshold value to M, and to set, as the output select signal, a signal for selecting the logical sum signal and/or the logical product signal.

12. The PWM generating circuit according to claim 10, wherein the PWM signal output means comprises:
    a first comparison circuit for comparing a count value of the first counter and the threshold value to change an output level;
    a second comparison circuit for comparing a count value of the second counter and the threshold value to change an output level; and
    selector means responsive to an output select signal determined from the duty setting signal to select either one of an output signal of the first comparison circuit and an output signal of the second comparison circuit to output the output signal thus selected,
    whereby in the case where logic "H" time of the desired PWM signal is M clock period (M is natural number), the PWM control means sets the threshold value to M, and to set, as the output select signal, a signal for alternately selecting an output signal of the first comparison circuit and an output signal of the second comparison circuit.

13. The PWM signal generating circuit according to claim 8,
wherein the PWM control means serves to reset the second counter in response to falling of the clock signal immediately after the PWM control means resets the first counter in response to rising of the clock signal.

14. The PWM signal generating circuit according to claim 8,
wherein the PWM control means resets the first counter in response to rising of the clock signal immediately after the PWM control means resets the second counter in response to falling of the clock signal.

15. The PWM signal generating circuit according to claim 8,
wherein the PWM control means repeats such an operation to reset the second counter in response to falling of the clock signal immediately after the PWM control means resets the first counter in response to rising of the clock signal to reset the first counter in response to rising of the clock signal immediately after the second counter is reset.

16. The PWM signal generating circuit according to claim 8,
wherein in the case where period of the desired PWM signal is N clock period (N is natural number), the PWM control means allows both operation time periods each serving as a time period which does not indicate the initial value of each of the first and second counters to be as (N−1) clock period to perform reset operation thereof.

17. The PWM signal generating circuit according to claim 16,
wherein the PWM signal output means comprises:
a first comparison circuit operative to compare a count value of the first counter and the threshold value to change an output level;
a second comparison circuit operative to compare a count value of the second counter and the threshold value to change an output level;
a logical sum element and/or a logical product element for generating a logical sum signal and/or a logical product signal of an output signal of the first comparison circuit and an output signal of the second comparison circuit; and
selector means responsive to an output select signal determined from the duty setting signal to select either one of an output signal of the first comparison circuit, an output signal of the second comparison circuit, and the logical sum signal and/or the logical product signal to output the signal thus selected,
whereby in the case where logic "H" time of the desired PWM signal is M+(½) clock period (M is natural number), the PWM control means serves to set the threshold value to M, and to set, as the output select signal, a signal for selecting the logical sum signal and/or the logical product signal.

18. The PWM generating circuit according to claim 16,
wherein the PWM signal output means comprises:
a first comparison circuit operative to compare a count value of the first counter and the threshold value to change an output level;
a second comparison circuit operative to compare a count value of the second counter and the threshold value to change an output level; and selector means responsive to an output select signal determined from the duty setting signal to select either one of an output signal of the first comparison circuit and an output signal of the second comparison circuit to output the output signal thus selected,
whereby in the case where logic "H" time of the desired PWM signal is M clock period (M is natural number), the PWM control means serves to set the threshold value to M, and to set, as the output select signal, a signal for selecting one of an output signal of the first comparison circuit and an output signal of the second comparison circuit.

19. A power supply apparatus adapted for converting power between power supply lines, comprising:
a power supply circuit connected to the plural power supply lines, and including a sensor and a switching element;
clock signal generating means for generating a clock signal;
control means connected to the sensor, and serving to determine duty of the switching element; and
a PWM signal generating circuit connected to the control means and the switching element,
wherein the PWM signal generating circuit is a PWM signal generating circuit for controlling duty of a PWM signal to generate a desired PWM signal,
the PWM signal generating circuit comprising:
counter means for counting the number of clocks on the basis of a clock signal;
PWM signal output means for comparing a count value of the counter means and a threshold value to change an output level to output the desired PWM signal; and
PWM control means operative to change period of the PWM signal and the threshold value on the basis of a duty setting signal determined from the desired PWM signal to be generated to control duty of a PWM signal that the PWM signal output means outputs.

20. A power supply apparatus adapted for converting power between power supply lines, comprising:
a power supply circuit connected to the plural power supply lines, and including a sensor and a switching element;
clock signal generating means for generating a clock signal; and
control means connected to the sensor and the switching element, and serving to determine duty of the switching element,
wherein the control means includes a PWM signal generating circuit for controlling duty of a PWM signal to generate a desired PWM signal,
the PWM signal generating circuit comprising:
counter means for counting the number of clocks on the basis of a clock signal;
PWM signal output means operative to compare a count value of the counter means and a threshold value to change an output level to output the desired PWM signal; and
PWM control means operative to change period of the PWM signal and the threshold value on the basis of a duty setting signal determined from the desired PWM signal to be generated to control duty of a PWM signal that the PWM signal output means outputs.

21. The power supply apparatus according to claim 20,
wherein the control means is constituted by a microprocessor or a programmable logic device comprising the PWM signal generating circuit.

* * * * *